(12) United States Patent
Cheng et al.

(10) Patent No.: US 10,050,196 B1
(45) Date of Patent: Aug. 14, 2018

(54) DIELECTRIC DOPED, SB-RICH GST PHASE CHANGE MEMORY

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/587,085

(22) Filed: May 4, 2017

(51) Int. Cl.
*G11C 11/00* (2006.01)
*H01L 45/00* (2006.01)
*H01L 27/24* (2006.01)
*G11C 13/00* (2006.01)

(52) U.S. Cl.
CPC ........ *H01L 45/144* (2013.01); *G11C 13/0004* (2013.01); *G11C 13/0097* (2013.01); *H01L 27/2463* (2013.01); *H01L 45/065* (2013.01); *H01L 45/126* (2013.01); *H01L 45/1233* (2013.01); *H01L 45/1625* (2013.01)

(58) Field of Classification Search
CPC ..................... G11C 13/0004; G11C 13/0097
USPC .......................... 365/163, 148; 257/503, 2–5
See application file for complete search history.

(56) References Cited

U.S. PATENT DOCUMENTS

| | | | |
|---|---|---|---|
| 6,800,504 B2 | 10/2004 | Li et al. | |
| 7,893,419 B2 | 2/2011 | Hudgens et al. | |
| 8,138,028 B2 | 3/2012 | Lung et al. | |
| 8,178,387 B2 | 5/2012 | Cheng et al. | |
| 8,324,605 B2 | 12/2012 | Lung et al. | |
| 8,330,137 B2 | 12/2012 | Schrott et al. | |
| 8,363,463 B2 | 1/2013 | Shih et al. | |
| 8,374,019 B2 | 2/2013 | Wu et al. | |
| 8,410,468 B2 | 4/2013 | Zheng | |
| 8,426,242 B2 | 4/2013 | Cheng et al. | |
| 8,646,666 B2* | 2/2014 | May ....................... | G10G 5/005 224/201 |

(Continued)

OTHER PUBLICATIONS

Chen, et al., "Endurance Improvement of Ge2Sb2Te5-Based Phase Change Memory," IEEE Int'l Memory Workshop, 2009, May 10-14, 2009, 2 pages.

(Continued)

*Primary Examiner* — Connie Yoha
(74) *Attorney, Agent, or Firm* — Haynes Beffel & Wolfeld LLP

(57) ABSTRACT

Phase change memory materials in a dielectric-doped, antimony-rich GST family of materials which are antimony rich relative to GST-225, are described that have speed, retention and endurance characteristics suitable for storage class data storage A memory device includes an array of memory cells, where each memory cell includes a first electrode and a second electrode coupled to a memory element. The memory element comprises a body of phase change memory material that comprises a combination of Ge, Sb, and Te with a dielectric additive in amounts effective to provide a crystallization transition temperature greater than to 160° C., greater that 170° C. in some effective examples and greater than 190° C. in other effective examples. A controller is coupled to the array, and configured to execute set operations and reset operations for memory cells in the array.

11 Claims, 15 Drawing Sheets

(56) References Cited

U.S. PATENT DOCUMENTS

| | | | |
|---|---|---|---|
| 8,772,747 | B2 | 7/2014 | Cheng et al. |
| 8,916,414 | B2 | 12/2014 | Cheng et al. |
| 8,932,901 | B2 | 1/2015 | Cheng |
| 8,946,666 | B2 | 2/2015 | Cheng et al. |
| 9,190,609 | B2 | 11/2015 | Zheng |
| 9,214,229 | B2 | 12/2015 | Cheng et al. |
| 9,337,421 | B2 | 5/2016 | Chin et al. |
| 2007/0171705 | A1 | 7/2007 | Parkinson |
| 2008/0142777 | A1 | 6/2008 | Park et al. |
| 2008/0253166 | A1 | 10/2008 | Raberg et al. |
| 2008/0272807 | A1 | 11/2008 | Lowrey |
| 2009/0014705 | A1* | 1/2009 | Hsu .................. H01L 45/06 257/3 |
| 2009/0194759 | A1 | 8/2009 | Chin et al. |
| 2009/0230375 | A1 | 9/2009 | Liang et al. |
| 2010/0051895 | A1* | 3/2010 | Hampton ............ C23C 14/3414 257/4 |
| 2010/0054029 | A1 | 3/2010 | Happ et al. |
| 2010/0328996 | A1* | 12/2010 | Shih .................. H01L 45/06 365/163 |
| 2011/0049456 | A1 | 3/2011 | Lung et al. |
| 2011/0084240 | A1 | 4/2011 | Schell et al. |
| 2011/0097825 | A1 | 4/2011 | Cheng et al. |
| 2011/0207284 | A1 | 8/2011 | Tominaga et al. |
| 2011/0317480 | A1* | 12/2011 | Lung ................. G11C 13/0004 365/163 |
| 2012/0062267 | A1* | 3/2012 | Saito .................. G11C 11/403 324/762.01 |
| 2012/0181499 | A1 | 7/2012 | Chuang et al. |
| 2012/0193595 | A1 | 8/2012 | Cheng et al. |
| 2012/0326111 | A1 | 12/2012 | Cheng et al. |
| 2013/0043375 | A1 | 2/2013 | Baleine et al. |
| 2013/0105759 | A1 | 5/2013 | Cheng |
| 2013/0234093 | A1 | 9/2013 | Cheng et al. |
| 2013/0277638 | A1 | 10/2013 | Moradpour et al. |
| 2014/0101371 | A1* | 4/2014 | Nguyen ............. G06F 3/0616 711/103 |
| 2014/0264240 | A1 | 9/2014 | Cheng et al. |
| 2014/0376309 | A1 | 12/2014 | Cheng et al. |
| 2015/0048291 | A1 | 2/2015 | Cheng et al. |
| 2016/0372661 | A1 | 12/2016 | Cheng et al. |

OTHER PUBLICATIONS

Cheng et al., "A thermally robust phase change memory by engineering the Ge/N concentration in (Ge, N)xSbyTe z phase change materiaL" 2012 Int'l IEEE IEDM, Dec. 10-13, 2012, 4 pages.

Cheng et al., "The Crystallization Behavior of Ga—Sb Materials as a Function of Composition for Phase Change Random Access Memory," Phase Change and Ovonics Symposium, Sep. 2011, 7 pages.

Cheng et al., Ga46Sb54 Material for Fast Switching and Pb-Free Soldering Reflow Process Complying Phase-Change Memory, ECS J. Solid State Sci. Technol. 2014 vol. 3, issue 7, Jun. 2014, p. 263-p. 267.

Cheng, et al., "A high performance phase change memory with fast switching speed and high temperature retention by engineering the GexSbyTez phase change material," 2011 IEEE Int'l IEDM, Dec. 5-7, 2011, 4 pages.

Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, pp. 30.6.1,30.6.4.

Ciocchini, N., et al. "Unified reliability modeling of Ge-rich phase change memory for embedded applications" IEEE Int'l Electron Devices Meeting (IEDM), Dec. 9-11, 2013, pp. 22.1.1,22.1.4.

Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.

Lu et al., Ga14Sb86 film for ultralong data retention phase-change memory, J. Appl. Phys. 109, 064503, Jun. 2011, 4 pages.

Morales-Sanchez et al., "Structural, electric and kinetic parameters of ternary alloys of GeSbTe," Thin Solid Films, vol. 471, Issues 1-2, Jan. 3, 2005, pp. 243-247.

Navarro, G., et al., "Trade-off between SET and data retention performance thanks to innovative materials for phase-change memory," IEEE Int'l Electron Devices Meeting (IEDM), Dec. 9-11, 2013, pp. 21.5.1,21.5.4.

Putero et al., Unusual crystallization behavior in Ga—Sb phase change alloys, APL Mat. 1, Jun. 21, 2001, Dec. 2013, 7 pages.

Raoux, et al. "Phase change materials and phase change memory," MRS Bulletin, 39(8), 703-710.

Shah et al., "GaSb—Ge pseudobinary phase diagram," Journal of Electronic Materials, vol. 11, Issue 1, Jan. 1982, 53-58.

Wimmer, et al., Role of activation energy in resistance drift of amorphous phase change materials, Frontiers in Physics, Dec. 2014, vol. 2, Article 75, pp. 1-12.

Zuliani, P., et al., "Overcoming Temperature Limitations in Phase Change Memories With Optimized GexSbyTez," IEEE Trans. on Electron Devices, 60(12), Dec. 2013, pp. 4020,4026.

* cited by examiner

DIELECTRIC DOPED, SB-RICH GST PHASE CHANGE MEMORY

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

Field of the Invention

The present technology relates to phase change materials, and high density memory devices based on such phase change based memory materials.

Description of Related Art

Phase change based memory materials, like chalcogenide based materials and similar materials, can be caused to change solid phase between an amorphous phase and a crystalline phase by application of electrical current at levels suitable for implementation in integrated circuits. The generally amorphous phase is characterized by higher electrical resistivity than the generally crystalline phase, which can be readily sensed to indicate data.

Phase change materials used for memory operations can be characterized by a number of different performance specifications including set and reset speeds, data retention, endurance, reset current, crystallization transition temperature $T_X$ and melting temperature $T_M$. The speed is a function of the pulse lengths required to cause the set and reset operations, as well as other factors. The data retention is a function, typically, of the tendency of the phase change material in the amorphous phase to crystallize over time and temperature so as to lose data. The endurance is a function of the phase change material tendency to become hard to set or hard to reset as the material is exposed to many set/reset cycles. The reset current has a value which is desirably low, but must be sufficient to cause heating in the active area sufficient to cause the phase transition (e.g. above the melting temperature $T_M$), and can be higher as the resistance level of the set state is lower.

The phase change material $Ge_2Sb_2Te_5$ known as GST-225 is considered to have good performance. Materials within the GST-225 family include $Ge_xSb_yTe_z$ (germanium—Ge, antimony—Sb, and tellurium—Te) compositions along the $Sb_2Te_3$ and GeTe tie line as reported in E. Morales-Sanchez, "Structural, electric and kinetic parameters of ternary alloys of GeSbTe", Thin Solid Films 471 (2005) 243-247.

These materials had been originally studied for optical disk technologies. However, GST-225 has several drawbacks when considered for application as an integrated circuit memory material. For example, it requires relatively high reset current.

Also, it has been observed that phase change memory cells fabricated from materials in the GST-225 family undergo undesired transformation from the amorphous reset state to the crystalline set state at elevated temperatures, limiting the data retention characteristics of memory cells using these materials.

The poor high temperature tolerance of GST-225 in particular has impeded use of the material for embedded memory applications, automotive applications and storage class memory applications. Also, storage class memory applications, for example, are usually specified by requirements of endurance higher than $10^7$ cycles, speed on the order of hundreds of nanoseconds, and good data retention. These requirements have not been achievable using GST-225 materials.

It is desirable therefore to provide a storage class memory based on phase change materials, and to provide a phase change memory more suitable for storage class memory applications, embedded memory applications and automotive applications.

SUMMARY

Phase change memory materials in a dielectric-doped, antimony-rich GST family of materials which are antimony rich relative to GST-225, are described that have speed, retention and endurance characteristics suitable for integrated circuit memory used for storage class data storage, and other applications that require good data retention, good speed, and high endurance.

The memory devices include an array of memory cells. Each memory cell includes a first electrode and a second electrode coupled to a memory element. The memory element comprises a body of phase change memory material between the first and second electrodes, wherein the body of phase change memory material comprises a combination of Ge, Sb, and Te with a dielectric additive in amounts effective to provide a crystallization transition temperature greater than to 160° C., greater that 170° C. in some effective examples and greater than 190° C. in other effective examples. A controller is coupled to the array, and configured to execute set operations and reset operations for memory cells in the array. The combination of Ge, Sb, and Te can comprise $Ge_xSb_yTe_z$, wherein x, y and z are atomic percentages, with a Ge atomic concentration x within a range from 13% to 18%, an Sb atomic concentration y within a range from 18% to 32% and a Te atomic concentration z within a range from 34% to 50%, and further comprising dielectric additive with an atomic concentration within a range of 10% to 30%. The dielectric additive can comprise a Si atomic concentration within a range from 7% to 17% and an O atomic concentration within a range from 0% to 23%. Methods for manufacturing memory cell devices using a phase change memory material are described herein.

Other aspects and advantages of the present invention can be seen on review of the drawings, the detailed description, and the claims which follow.

DETAILED DESCRIPTION

A detailed description of embodiments of the present invention is provided with reference to the FIGS. 1-20.

Figure 1:
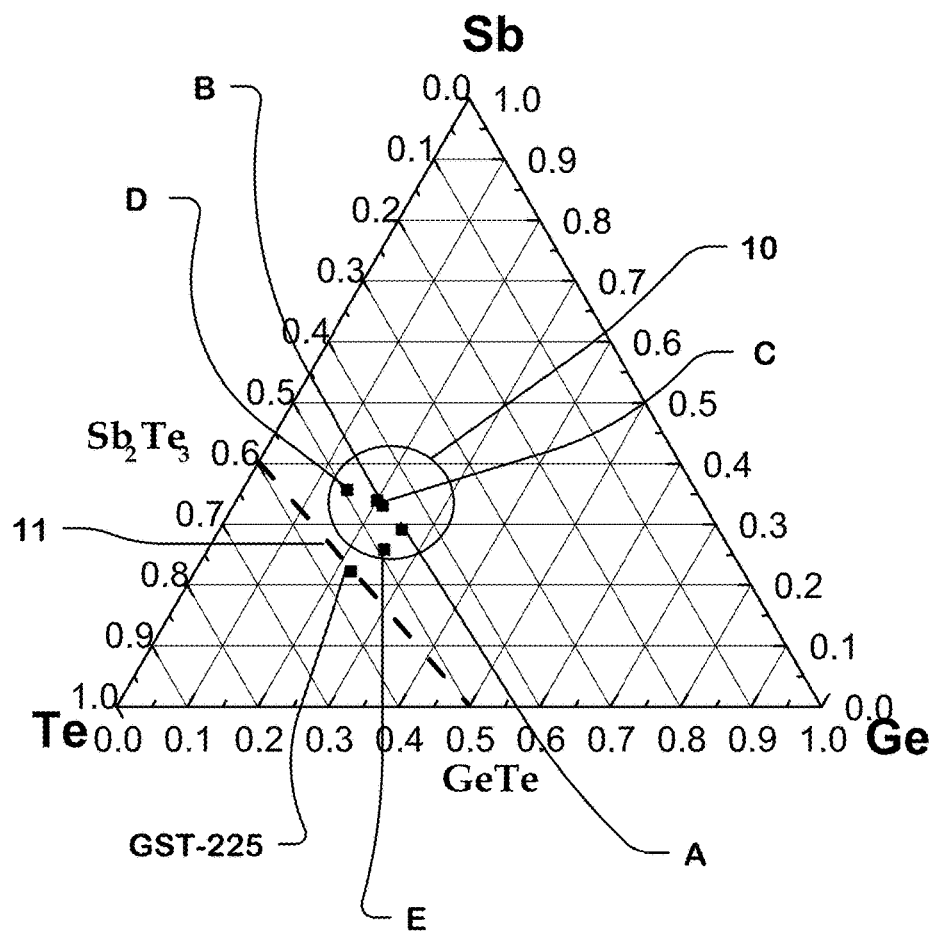
FIG. 1 is a ternary diagram for $Ge_xSb_yTe_z$ showing GST-225 and a dielectric-doped, Sb-rich GST-225 family over the GeTe—$Sb_2Te_3$ tie line.

FIG. 1 is a ternary diagram for $Ge_xSb_yTe_z$ (germanium—Ge, antimony—Sb, tellurium—Te), showing a dielectric-doped, Sb-rich GST-225 family of materials in region 10 over the GeTe—$Sb_2Te_3$ tie line 11. The concentrations are normalized so that they amount in sum to 100%, after subtracting the dielectric doping amounts.

The family of materials, termed herein the "dielectric-doped, Sb-rich GST-225 family" of materials, is distributed on the Sb rich side of the tie line 11. The family includes the group of $Ge_xSb_yTe_z$ Ge atomic concentration x within a range from 13% to 18%, an Sb atomic concentration y within a range from 18% to 32% and a Te atomic concentration z within a range from 34% to 50%. The dielectric additive of silicon or silicon oxide has an atomic concentration within a range of 10% to 30%. In the tested embodiments, the dielectric additive comprises an Si atomic concentration within a range from 7% to 17% and an O atomic concentration within a range from 0% to 23%.

In the ternary diagram, the material GST-225 is shown on the tie line 11. It is known to have a crystallization transition temperature $T_X$ of about 150° C.

Also in the ternary diagram five example materials from the dielectric-doped, Sb-rich GST-225 family are shown, including materials A-E. The compositions, and the crystallization transition temperature $T_X$, for each of the materials A-E are set forth in the following table. In the table, the numerals in each of the columns for the elements are atomic concentrations. In materials D and E, no oxygen ("X") was detected in the measurements. In the final column, the measured crystallization transition temperature in ° C. is provided.

| Materials | Ge | Sb | Te | Si | O | $T_X$ |
|---|---|---|---|---|---|---|
| A | 17.6 | 18.2 | 34.5 | 8.3 | 21.4 | 163 |
| B | 16.1 | 27.8 | 39.2 | 6.5 | 10.4 | 175 |
| C | 16.9 | 26.3 | 36.3 | 7 | 13.5 | 197 |
| D | 13 | 31 | 43 | 13 | X | 175 |
| E | 17.6 | 21.7 | 49.5 | 11.3 | X | 163 |

As can be seen, in all of these five example materials the various elements have the atomic concentrations in amounts effective to establish a crystallization transition temperature of greater than 160° C., demonstrating that these, or other materials in the dielectric doped, Sb-rich GST-225 family with concentrations of elements similarly effective, can have a crystallization transition temperature of greater than 160° C. Furthermore, in materials B, C and D the various elements have the atomic concentrations in amounts effective to establish a crystallization transition temperature greater than 170° C., demonstrating that these, or other materials in the dielectric doped, Sb-rich GST-225 family with concentrations of elements similarly effective, can have a crystallization transition temperature of greater than 170° C. In material C, the atomic concentrations of the various elements have amounts effective to establish a crystallization transition temperature greater than 190° C., demonstrating that Material C, or other materials in the dielectric doped, Sb-rich GST-225 family with concentrations of elements similarly effective, can have a crystallization transition temperature of greater than 190° C.

Figure 2:
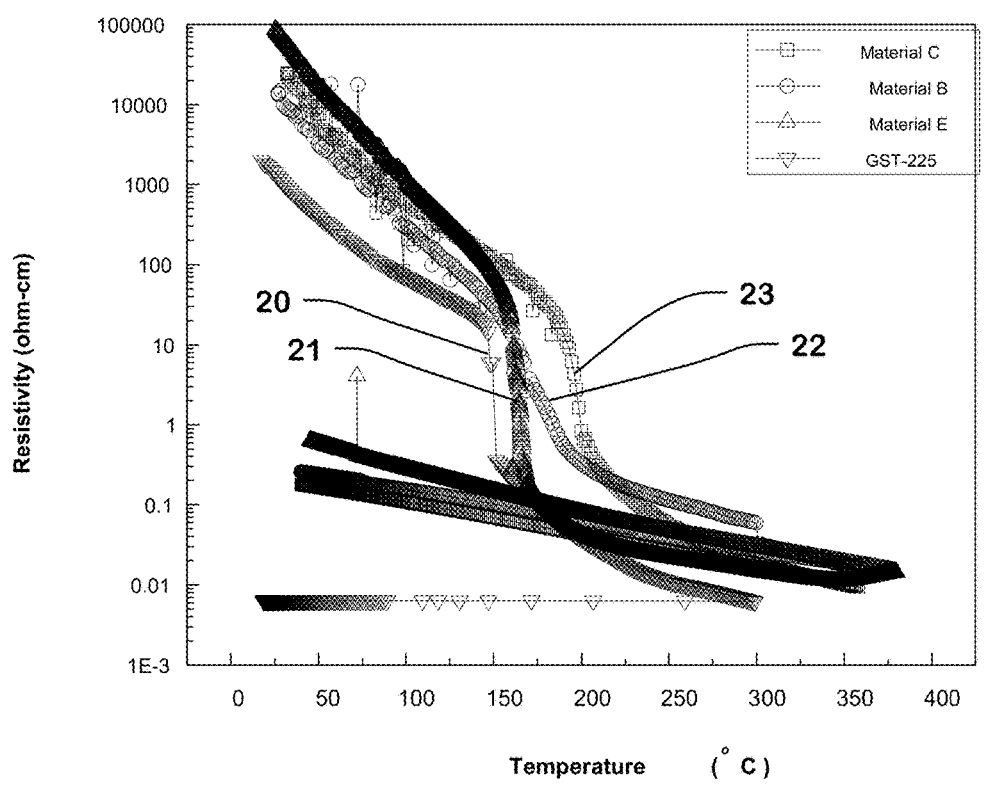
FIG. 2 is a graph showing resistivity versus temperature for materials described herein.

FIG. 2 is a graph of resistivity versus temperature produced as a result of the process for measuring the crystallization transition temperature. The crystallization transition temperature $T_X$ as used herein is the crystallization transition temperature measured using an as-deposited thin film of the material, instead of measuring the material in situ of a memory device. In measurement of the transition temperature of an as-deposited thin film, the thin film can be on the order of 50 to 100 nm thick, but resistivity measurement processes are the same for differences in thickness of the as-deposited film.

The graph includes the first trace 20 produced for GST-225, a second trace 21 produced for material E, a third trace 22 produced for material B and fourth trace 23 produced for material C. All of materials B, C and E show a higher crystallization transition temperature, and a higher crystalline phase resistivity than GST-225. As a result, memory cells based on such materials can be operated using lower reset currents. Materials A and D are expected to also show these properties.

These five example materials all show higher crystallization transition temperature $T_X$ than GST-225, which indicates that the materials will show better data retention capabilities.

An important factor for developing new phase change materials is the resistivity of phase change materials, and the resistance of memory cells using such materials. The resistance of the cell in the crystalline phase is important in particular, because it is a determinative factor in the magnitude of reset current, which the device requires. For GST-225, the resistivity in the crystalline phase is very low, so memory cells utilizing this material require very high current for reset.

Compared to GST-225, members of the dielectric-doped, Sb-rich GST-225 family, with effective concentrations of elements, can have higher crystallization transition temperatures $T_X$, and high dynamic resistance at the melting points, which combine to result in low reset current, and good endurance while maintaining a fast enough speed.

Thus, it is discovered that by increasing the antimony Sb content with extra dielectric doping, and in particular silicon dioxide doping, the transition temperature $T_X$ and the resistivity in the crystalline phase can be significantly increased. The higher resistivity in the crystalline phase indicates that a lower reset current will be required for memory cells utilizing the material, allowing for lower power operation.

The as-deposited thin film crystallization transition temperature $T_X$ can be 50 to 100° C. higher than the in situ transition temperature for a memory cell, where the amount of variation between the as-deposited and in situ forms varies for different materials, and for different configurations of memory cells using the same materials, and for other reasons. Thus, to achieve a given operating specification applied to the in situ memory element, the crystallization transition temperature $T_X$ as used herein must be much higher than the specification.

Memory cells having a structure like that of FIG. 16 described below, have been made and tested using materials A, B, C, D and E in the dielectric-doped, Sb-rich GST-225 family, and using GST-225, and results of such testing described herein.

Figure 3:
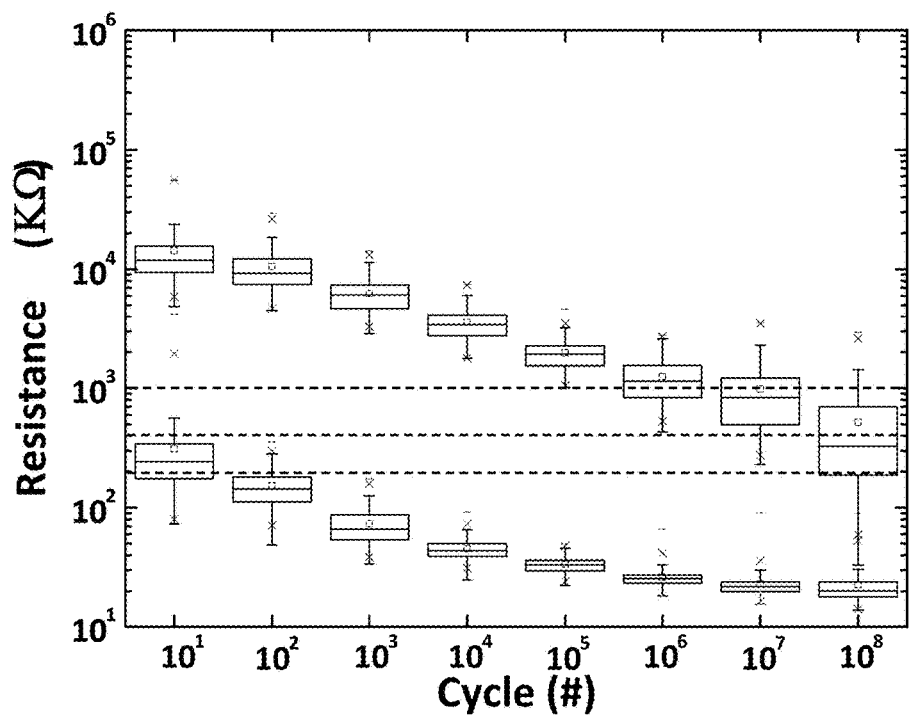
FIG. 3 is a chart showing box plots of distributions in resistance versus cycle numbers for measuring endurance of memory cells using material C described herein.
Figure 4:
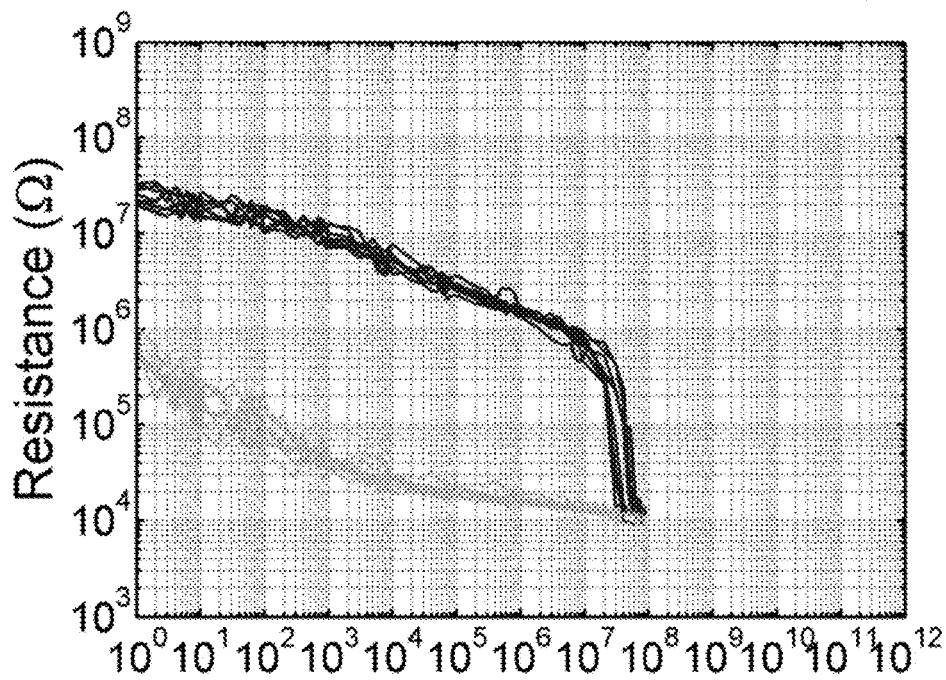
FIG. 4 is a line graph of resistance versus cycle number illustrating endurance of memory cells using material C described herein.

Material C is particularly suited for storage class operations. FIGS. 3 and 4 illustrate cycling endurance characteristics of Material C. FIG. 3 is a graph including box plots showing the resistance distributions for the set (lower distributions) and reset (higher distributions) states, versus the numbers of set/reset cycles for Material C. The box plots illustrate a minimum, a first quartile, a median, a third quartile and a maximum of the distribution data. As illustrated, read margins in the range of about one MegaOhm to about 200 KiloOhms are maintained for $10^7$ cycles.

FIG. 4 is a graph of cell resistance versus cycle number showing that the read margin is lost at about $10^7$ cycles as well.

Figure 5:
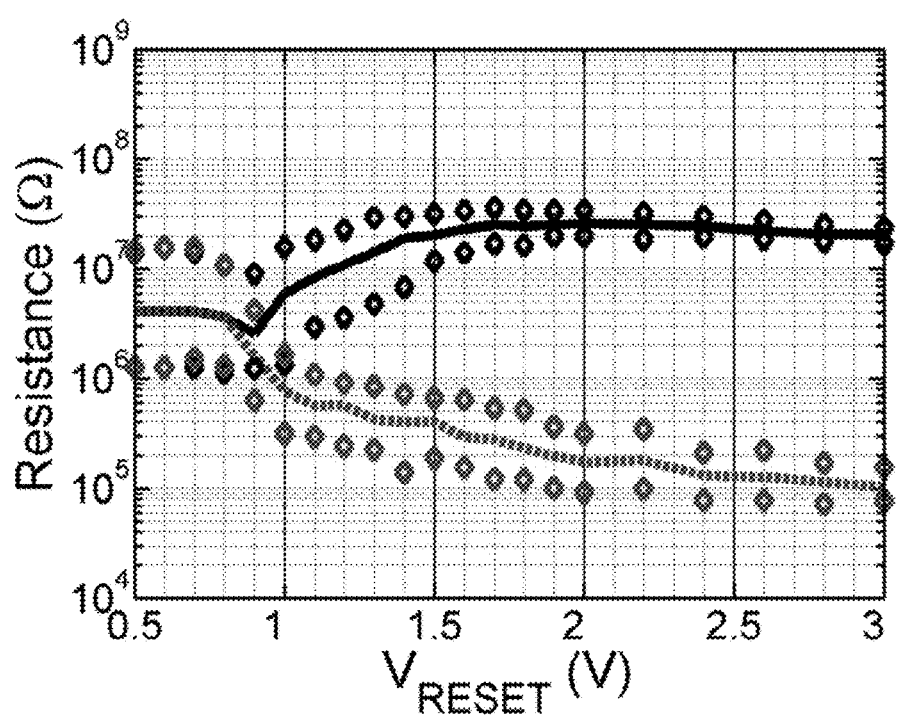
FIG. 5 is a graph of resistance versus reset voltage generated using a sequence of set/reset cycles with increasing reset voltage for a 200 µA reset current for material C.

FIG. 5 is a graph showing performance of Material C with a reset current of about 200 μA. This graph is produced starting with a cell in an initial resistance state, and cycling through set and reset pulses with increasing reset voltage. As can be seen, as the read margin is well-established with a reset voltage on the order of 2 V, at a reset current of about 200 μA or less.

Figure 6:
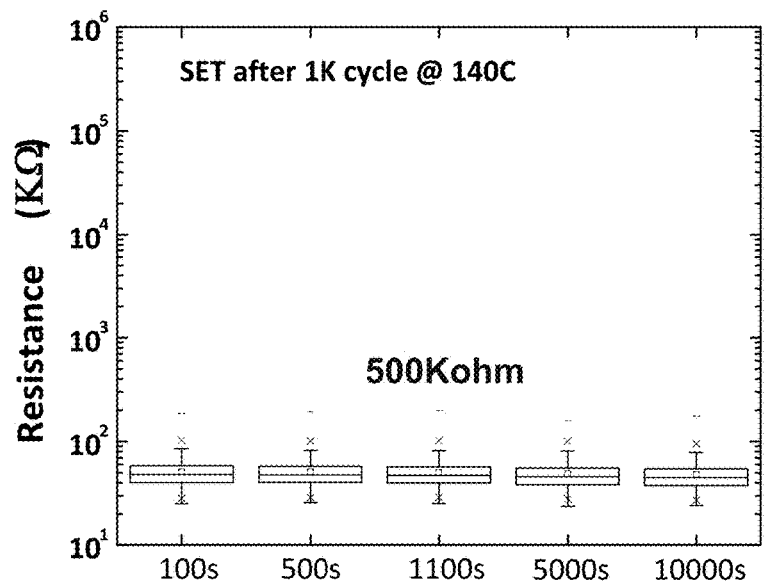
FIG. 6 is a chart showing box plots of distributions in resistance versus baking time at 140° C. for set distributions using material C described herein after 1000 cycles.

FIG. 6 is a chart showing box plots of distributions in resistance of memory cells utilizing Material C that had been exposed to 1000 set/reset cycles and maintained at 140° C. for the lengths of time on the horizontal axis. Thus, the retention in the set state is very good for Material C.

Figure 7:
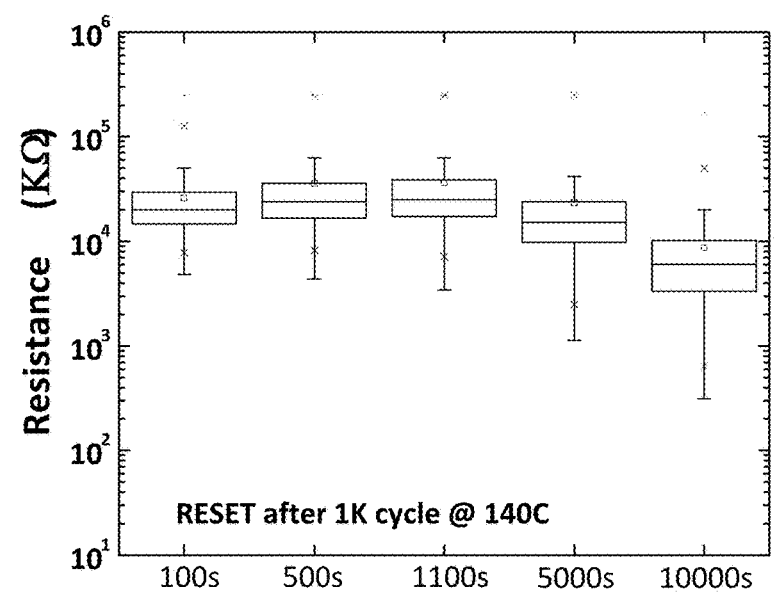
FIG. 7 is a chart showing box plots of distributions in resistance versus baking time at 140° C. for reset distributions using material C described herein after 1000 cycles.

FIG. 7 is a chart showing box plots of distributions in resistance of memory cells utilizing Material C that had been exposed to 1000 set/reset cycles and maintained at 140° C. for the lengths of time on the horizontal axis. The retention for the reset state is also very good for Material C.

Figure 8:
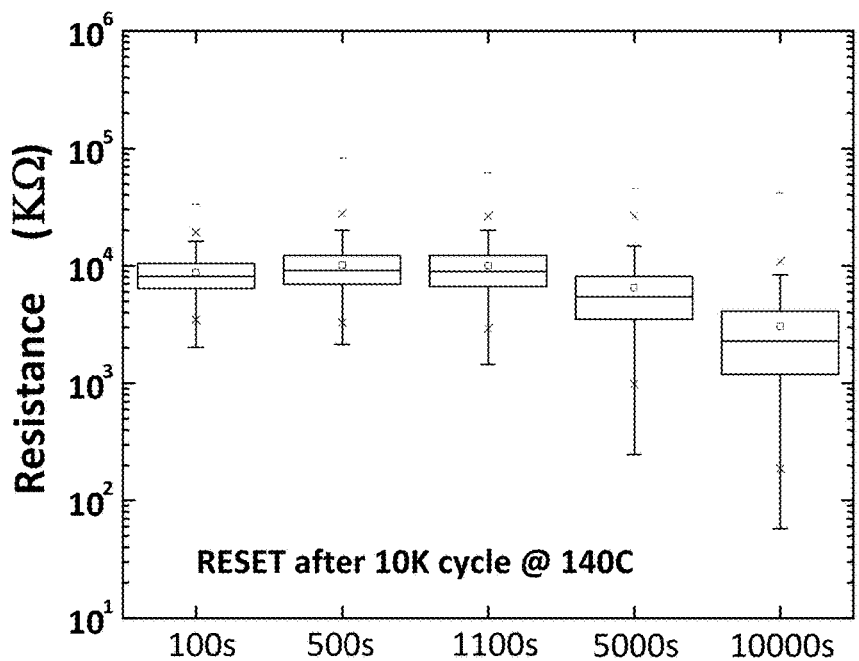
FIG. 8 is a chart showing box plots of distributions in resistance versus baking time at 140° C. for reset distributions using material C described herein after 10,000 cycles.

FIG. 8 is a chart like FIG. 7, showing box plots of distributions in resistance of memory cells utilizing Material C that have been exposed to 10,000 set/reset cycles and maintained at 140° C. for the lengths of time on the horizontal axis. This illustrates that the data retention characteristics of the material decreased only a small amount with increased cycles at 140° C.

Figure 9:
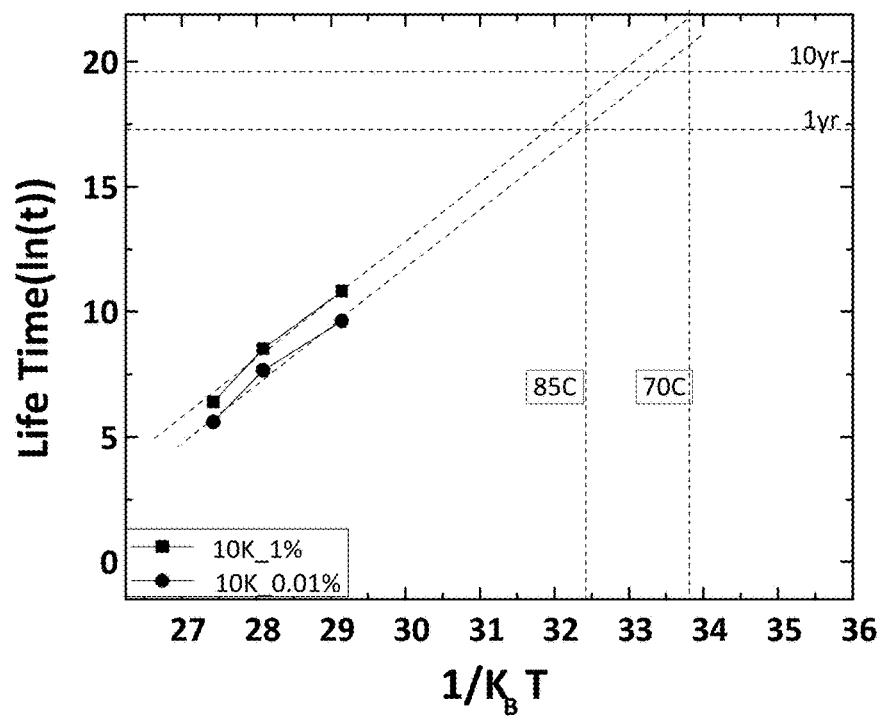
FIG. 9 is a graph illustrating computation of data retention lifetime for using material C described herein.

FIG. 9 is a graph illustrating computation of retention at 85° C. for one year for Material C, based on the measurements of data retention time (time of failure). The vertical axis is the natural log of time ln(t) in seconds. The horizontal axis is the parameter $1/K_BT$ with plot points at 125°, 140° and 150° C., where $K_B$ is the Boltzmann constant and T is temperature in ° Kelvin. This demonstrates that an array of memory cells on Material C, or other materials in the dielectric doped, Sb-rich GST-225 family with concentrations of elements which are similarly effective, can retain useable data for at least one year at operating temperatures of 85° C.

Figure 10:
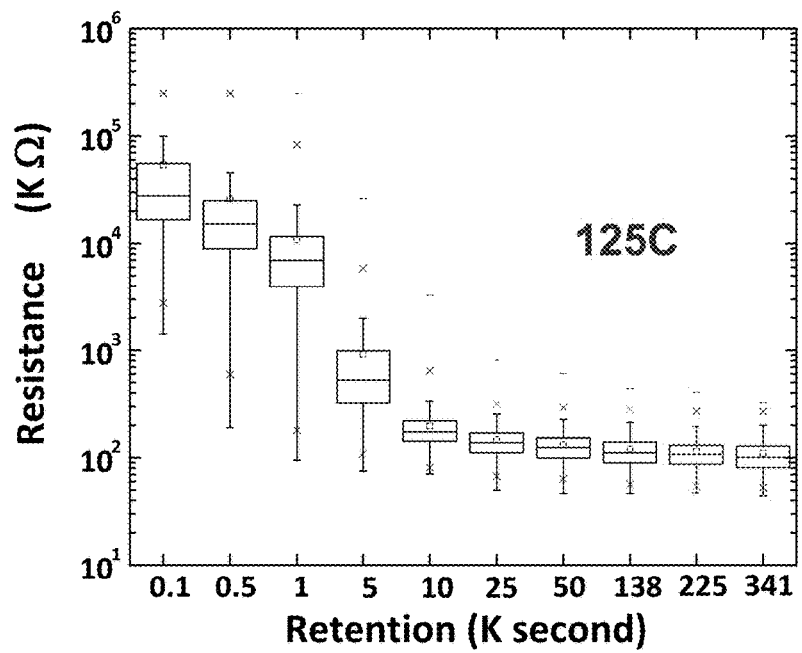
FIG. 10 is a chart showing box plots of reset distributions in resistance versus baking time at 125° C. for material E.
Figure 11:
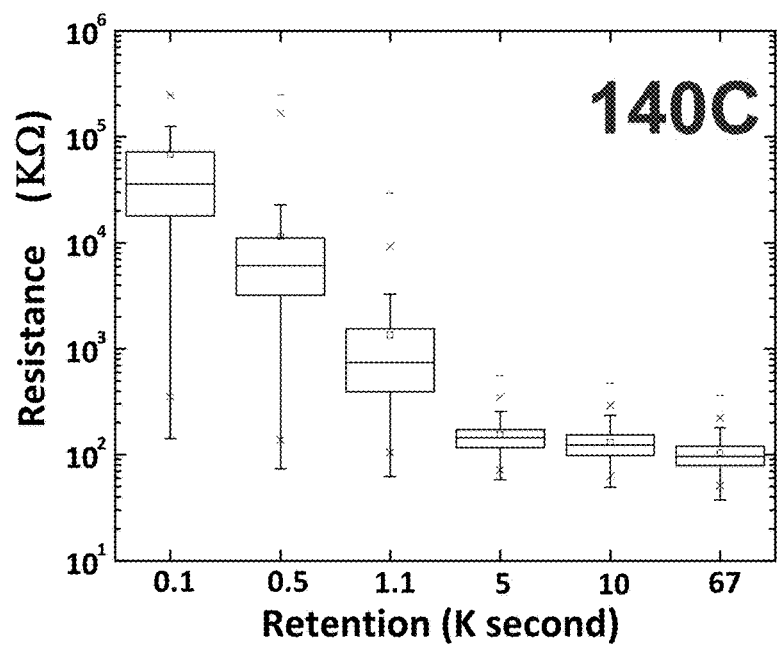
FIG. 11 is a chart showing box plots of reset distributions in resistance versus baking time at 140° C. for material E.
Figure 12:
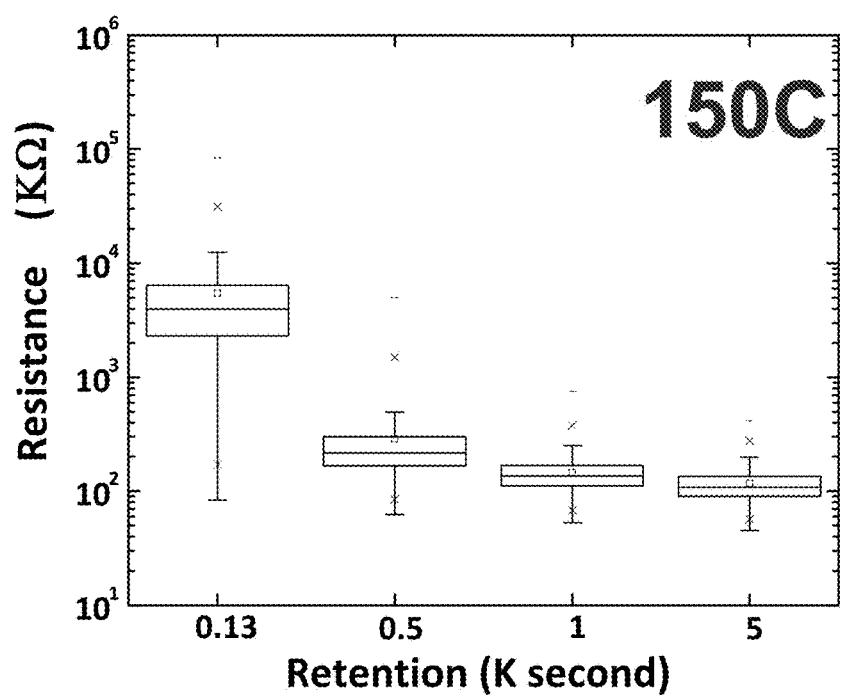
FIG. 12 is a chart showing box plots of reset distributions in resistance versus baking time at 150° C. for material E.
Figure 13:
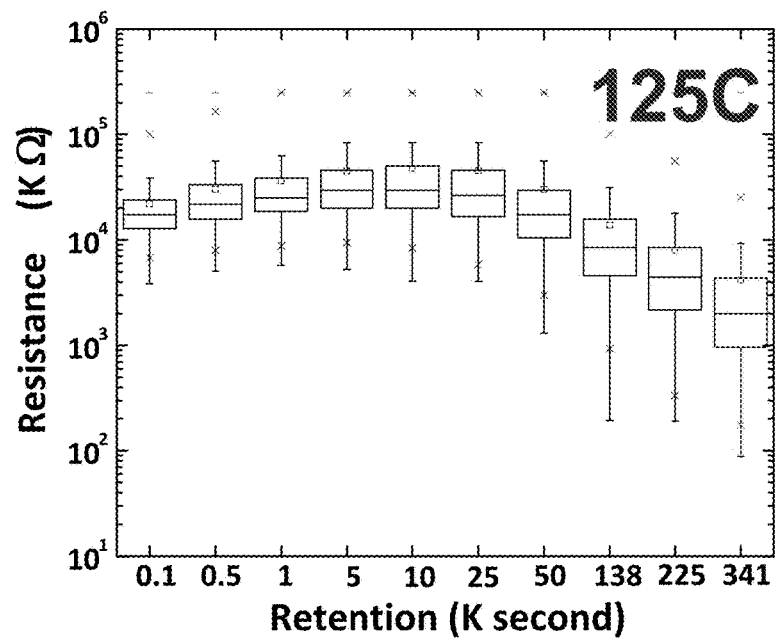
FIG. 13 is a chart showing box plots of reset distributions in resistance versus baking time at 125° C. for material C.
Figure 14:
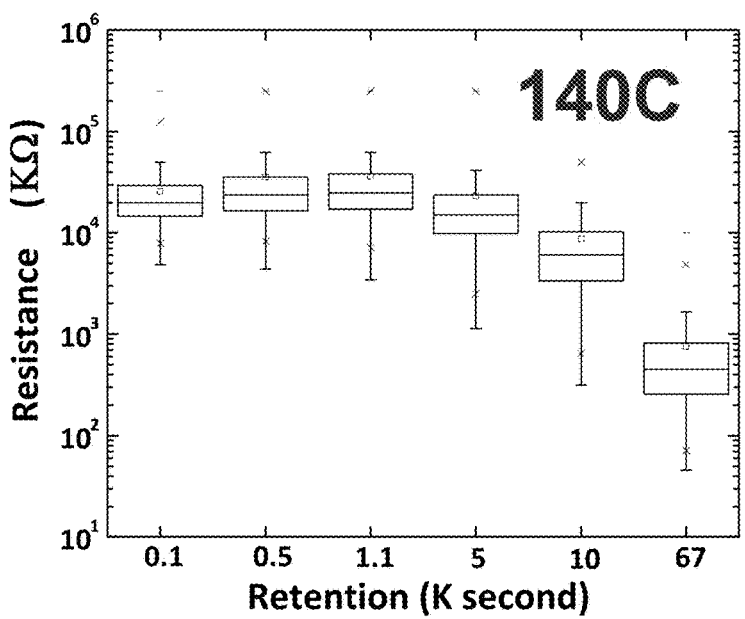
FIG. 14 is a chart showing box plots of reset distributions in resistance versus baking time at 140° C. for material C.
Figure 15:
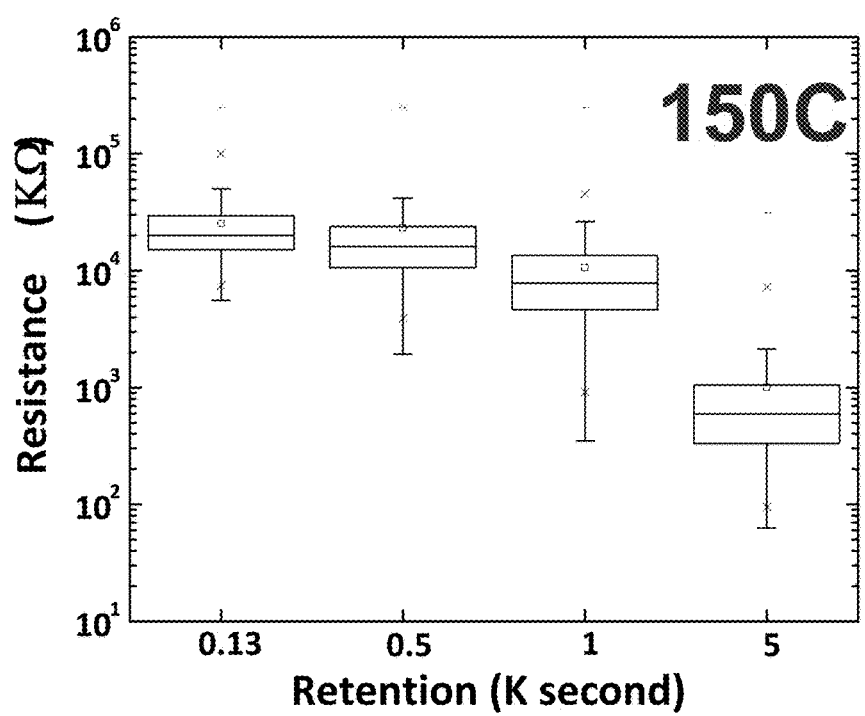
FIG. 15 is a chart showing box plots of reset distributions in resistance versus baking time at 150° C. for material C.

FIGS. 10, 11 and 12 are graphs showing box plots of distributions of resistance versus retention time, that illustrate reset state retention characteristics for material E with plot points at 125° C., 140° C., and 150° C. respectively. In contrast, FIGS. 13, 14 and 15 are graphs showing box plots of distributions of resistance versus retention time, that illustrate reset state retention characteristics for material C. As can be seen, the retention characteristics that these elevated temperatures for material E are relatively poor compared to those of Material C. The computed retention at 85° C. for Material E is on the order of one day in contrast to that of Material C which as mentioned above is on the order of one year at this temperature.

Performance in terms of reset current, set resistance, speed, endurance (cycle) and data retention (life time) of tested devices formed using materials B, C and E are shown in the following table.

|  | SET R | Speed | Cycle | Life Time |
|---|---|---|---|---|
| Material E | <500K ohm | 200 ns | >$10^8$ | 85 C./5 days |
| Material C (best composition) | <200K ohm | 500 ns | >$10^7$ | 85 C./1 years |
| Material B | ~50 K ohm | 300 ns | >$10^7$ | 85 C./110 days |

As demonstrated, materials in the dielectric doped, Sb-rich GST-225 family described herein can provide fast speed, good data retention and good endurance for phase change memory devices. Materials in this family can be utilized in the implementation of storage class memory devices for long term storage of data.

Figure 16:
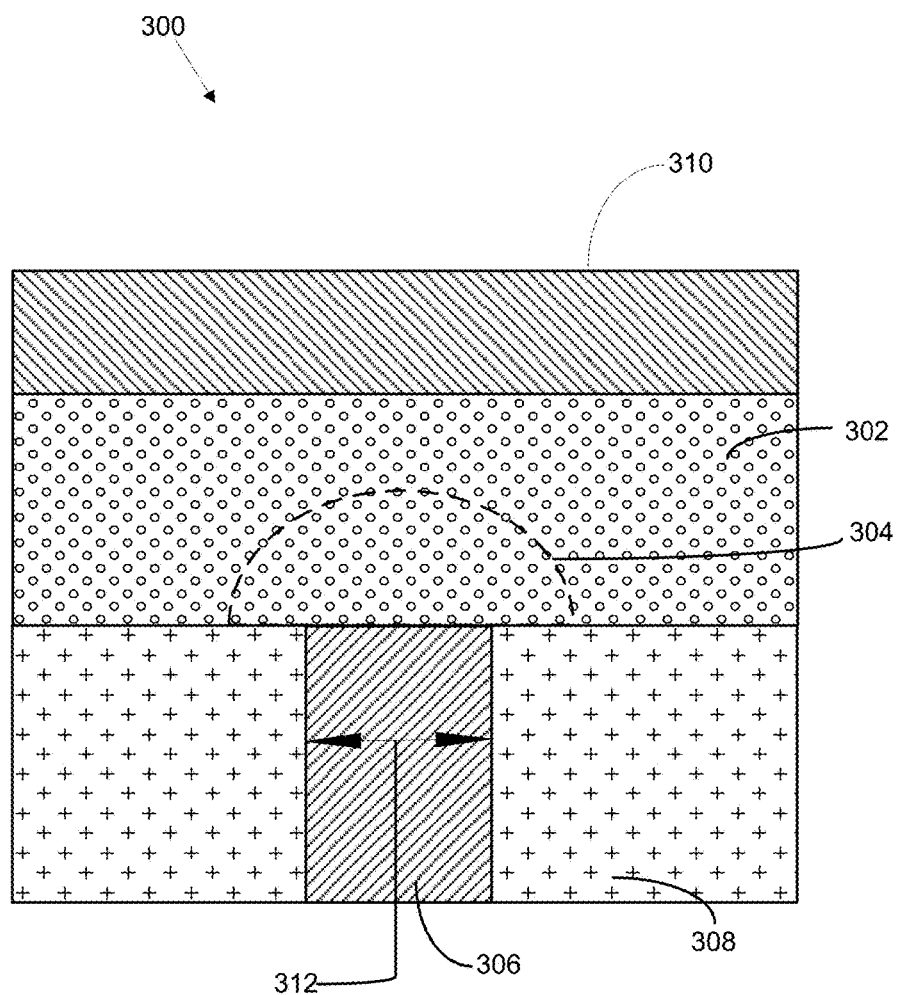
FIG. 16 illustrates a structure of a first memory cell structure suitable for the memory material described herein.

FIG. 16 illustrates a cross-sectional view of a memory cell 300 that is fabricated from a dielectric-doped, Sb-rich GST-225 family material. The memory cell 300 comprises a memory element 302 consisting of a body of memory material. The memory cell 300 includes an active region 304. The memory cell 300 includes a first electrode 306 extending through dielectric layer 308 to contact a bottom surface of the memory element 302. A second electrode 310 is formed on the memory element 302 to create a current between the first electrode 306 and the second electrode 310 through the memory element 302. The first and second electrodes 306 and 310 may comprise, for example, TiN or TaN. Alternatively, the first and second electrodes 306 and 310 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. The dielectric layer 308 may comprise silicon nitride, silicon oxynitride, silicon oxide and any other suitable dielectric material.

The described memory cell has a first electrode 306 with a relatively narrow width 312 (which in some embodiments is a diameter). The narrow width 312 of the first electrode 306 results in an area of contact between the first electrode 306 and the memory element 302 that is less than the area of contact between the memory element 302 and the second electrode 310. Thus, current is concentrated in the portion of the memory element 302 adjacent the first electrode 306, resulting in the active region 304 being in contact with or near the first electrode 306, as shown. The memory element 302 also includes an inactive region outside the active region 304, which is inactive in the sense that it does not undergo phase transitions during operation.

Figure 17:
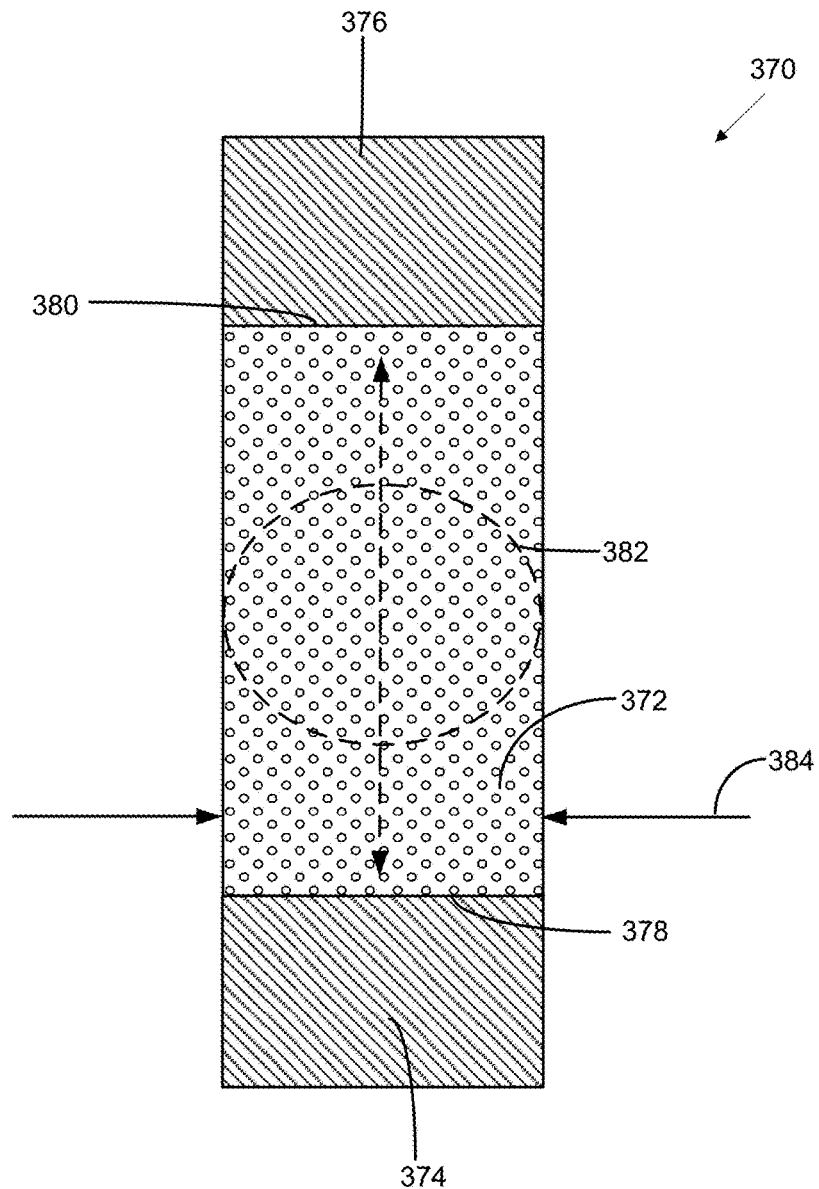
FIG. 17 illustrates a structure of a second memory cell structure suitable for the memory material described herein.

FIG. 17 illustrates a cross-sectional view of an alternative memory cell 370 design. Memory cell 370 includes a memory element 372 consisting of a body of phase change material from the dielectric-doped, Sb-rich GST-225 family in an inter-electrode current path through memory element 372. The memory element 372 is in a pillar shape and contacts first and second electrodes 374 and 376 at top and bottom surfaces 378 and 380, respectively. The memory element 372 has a width 384 substantially the same as that of the first and second electrodes 374 and 376 to define a multi-layer pillar surrounded by dielectric (not shown). As used herein, the term "substantially" is intended to accommodate manufacturing tolerances. In operation, as current passes between the first and second electrodes 374 and 376 and through the memory element 372, the active region 382 heats up more quickly than the other regions within the memory element. This leads to a majority of the phase transformation occurring within the active region during device operation.

Figure 18:
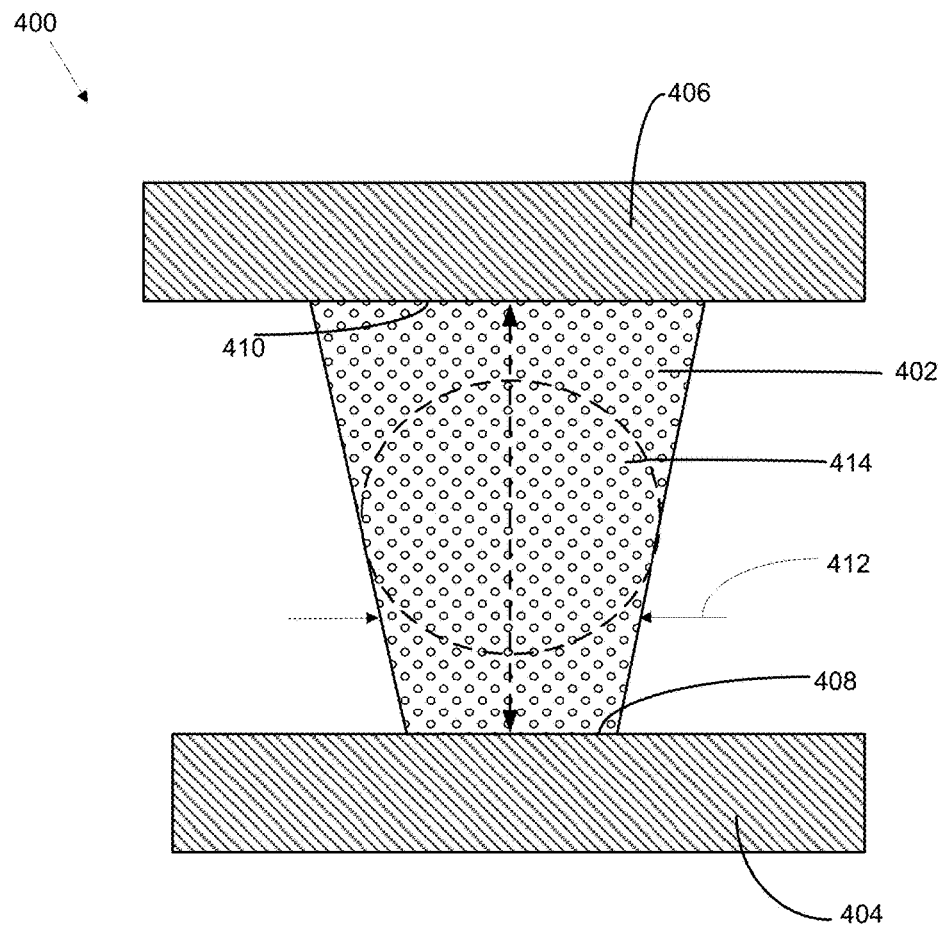
FIG. 18 illustrates a structure of a third memory cell structure suitable for the memory material described herein.

FIG. 18 illustrates a cross-sectional view of an alternative memory cell 400 design. The memory cell 400 includes a memory element 402 consisting of a body of phase change material from the dielectric-doped, Sb-rich GST-225 family in an inter-electrode current path through the memory element 402. The memory element 402 is surrounded by dielectric (not shown) contacting first and second electrodes 404 and 406 at top and bottom surfaces 408 and 410, respectively. The memory element 402 has a varying width 412 that is always less than the width of the first and second electrodes. In operation, as current passes between the first and second electrodes 404 and 406 and through the memory element 402 the active region 414 heats up more quickly than the remainder of the memory element. Thus the volume of memory element 402 within the active region is where a majority of the phase transformation occurs during device operation.

As will be understood, the memory material from the dielectric-doped, Sb-rich GST-225 family, as described herein, can be used in a variety of memory cell structures and is not limited to the memory cell structures described herein.

Figure 19:
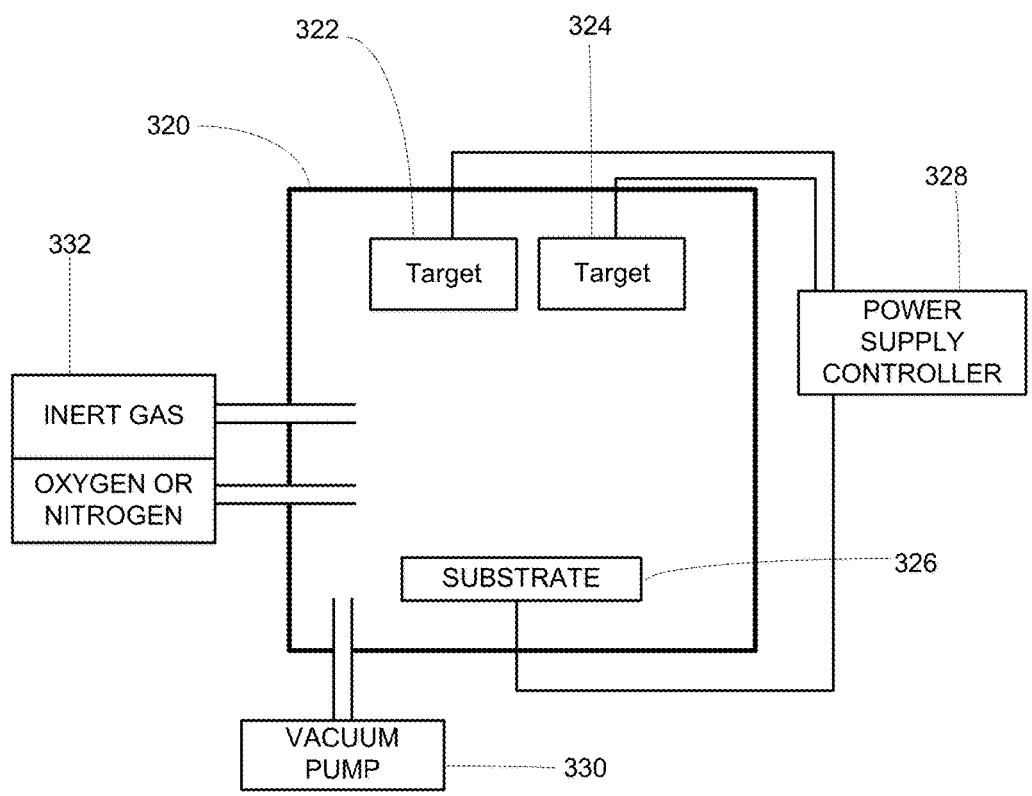
FIG. 19 is a simplified diagram of a sputter chamber which can be used in the manufacturing of the materials described herein.

FIG. 19 is a simplified diagram of a sputtering system usable for creating a dielectric-doped, Sb-rich GST-225 family device. The sputtering system includes a chamber 320 in which a set of sputter targets, including sputter target 322 and sputter target 324 in this illustration, and a substrate 326 are mounted, and exposed to co-sputtering process, which uses a $Ge_xSb_xTe_x$ target with particular Ge, Sb and Te concentrations with a $SiO_2$ target. Alternatively, a single target including (GexSbyTez+Si) can be used with oxygen reactive sputtering. Other alternatives can be used as well. The set of sputter targets can include more than two members in some embodiments. The set of sputter targets can include targets for the elements Ge, Sb, Te and Si, for example. The set of sputter targets and substrate 326 are coupled to a power supply and controller 328 that are used to apply bias voltages during the sputtering process. Bias voltages applied can be DC, pulsed DC, radio frequency, and combinations thereof, and turned on and off and modulated by the controller, as suits a particular sputtering process. The sputter chamber 320 is equipped with a vacuum pump 330 or other means for evacuating the chamber and removing exhaust gases. Also, the chamber is configured with a gas source 332. In one embodiment of the present invention the gas source 332 is a source for an inert gas such as argon. In addition, some embodiments may include a gas source 332 of the reaction gas, such as oxygen or nitrogen in the examples for use in causing addition of other components. The system has the ability to dynamically control the flow of gases from the source 332 in order to have an effect on the composition of the layer being formed in the sputtering process. The power applied by the power supply and controller 328 to the set of sputter targets can be used to control the composition of the as-deposited layer, so that it falls in the dielectric-doped, Sb-rich GST-225 family of materials.

A collimator (not shown) can be used when sputtering a substrate that includes high aspect ratio features, to improve the uniformity of coverage over the high aspect ratio features, and for other reasons. Some sputtering systems have the ability to move a collimator into and out of the sputtering chamber as needed.

It will be appreciated that this is a simplified diagram sufficient for heuristic purposes of description herein. Sputter chambers are standard equipment in semiconductor manufacturing factories, and available from a variety of commercial sources.

A process flow for forming a layer of dielectric-doped, Sb-rich GST-225 family phase change material can be executed using a sputtering system such as described above. The process includes first mounting the wafer in a sputter chamber having the selected material targets for the composition being formed. Next, the chamber is evacuated to allow for the creation of a flow of ions sputtered from the target source or sources. An inert gas such as argon, combined with a reactive oxygen for formation of dielectric doping in the material, is flowed into the chamber, to establish an atmosphere suitable for sputtering. Suitable bias voltages are applied across the substrate and targets, such as a DC bias, to establish an electric field within the sputter chamber necessary to induce the sputtering process. Optionally, a pre-sputtering interval can be executed to prepare the target before exposing the wafer to the sputtering atmosphere. The conditions for sputtering are maintained with the wafer exposed, for an interval of time sufficient to obtain the desired thickness of memory material on the substrate. The bias is turned off, and the chamber is flushed. Finally, the wafer or substrate with deposited layer of memory material is removed.

A manufacturing process flow for manufacturing a memory cell including a memory element with a structure of the memory cell in FIG. 16 can include forming a first electrode 306 having a width 312 (or diameter) is formed extending through dielectric layer 308. The first electrode 306 comprises TiN and the dielectric layer 308 comprises SiN. Alternatively the first electrode 306 can have a sub-lithographic width 312 (or diameter).

The first electrode 306 is connected to a connector extending through dielectric layer 308 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and source lines, conductive plugs, and doped regions within a semiconductor substrate.

The first electrode 306 and the dielectric layer 308 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Pat. No. 8,138,028), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 306. Next, the mask of photoresist is trimmed, using for example oxygen plasma, to form a mask structure having sub-lithographic dimensions overlying the location of the first electrode 306. Then the layer of electrode material is etched using the trimmed mask of photoresist, thereby forming the first electrode 306 having a sub-lithographic width 312. Next dielectric material is formed and planarized to form dielectric layer 308.

A phase change element is formed having a material from the dielectric-doped, Sb-rich GST-225 family, such as Material C.

Next, a second electrode 310 is formed and back-end-of-line (BEOL) processing is performed to complete the semiconductor process steps of the chip, resulting in the structure illustrated in FIG. 16. The BEOL processes can be standard processes as known in the art, and the processes performed depend upon the configuration of the chip in which the memory cell is implemented. Generally, the structures formed by BEOL processes may include contacts, interlayer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 14 are formed on the device.

Figure 20:
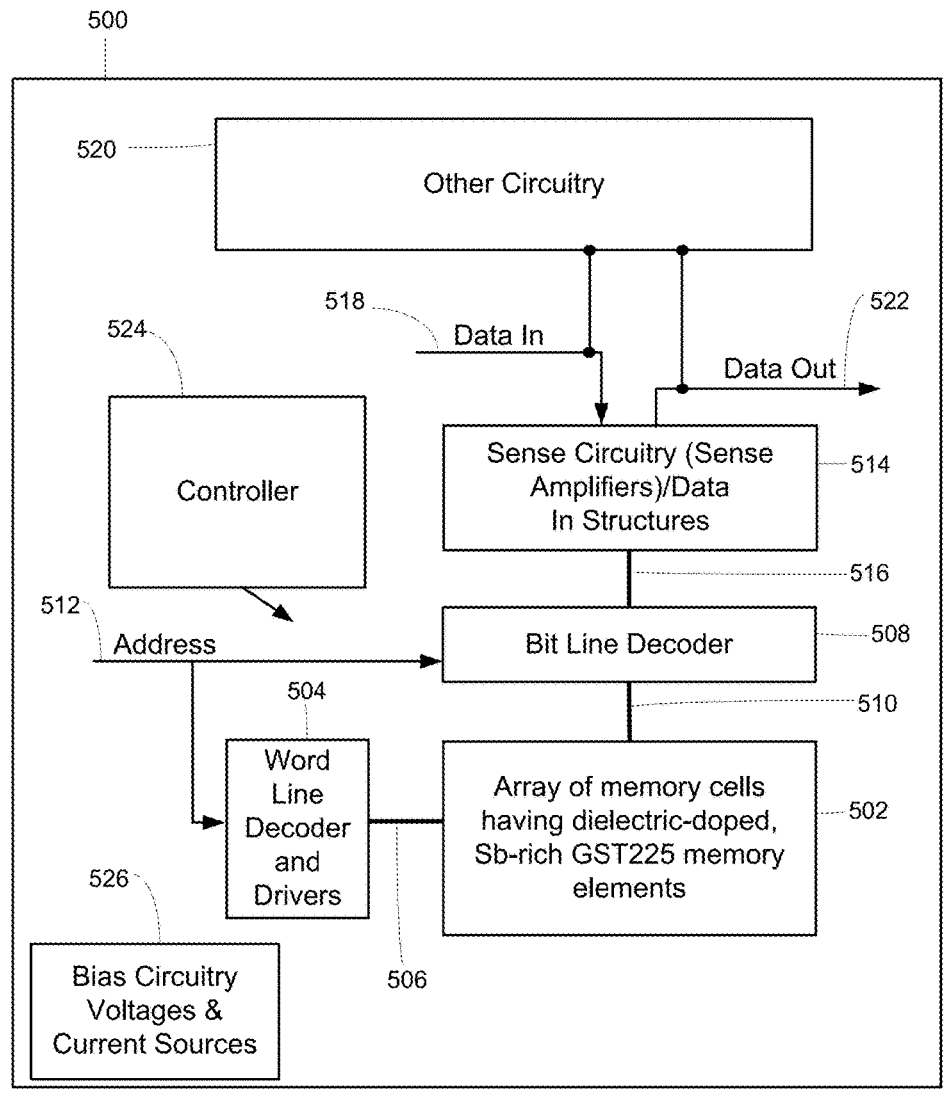
FIG. 20 is a simplified block diagram of an integrated circuit implementing an array of memory cells fabricated from a dielectric-doped, Sb-rich GST-225 family material.

FIG. 20 is a simplified block diagram of an integrated circuit 500 including a memory array 502 having memory cells with memory elements comprised of materials within the dielectric-doped, Sb-rich GST-225 family, such as material C, with speed, endurance and retention specifications suitable for storage class applications. A word line decoder at 504 having read, set and reset modes is coupled to and in electrical communication with a plurality of word lines 506 arranged along rows in the memory array 502. A bit line (column) decoder 508 is in electrical communication with a plurality of bit lines 510 arranged along columns in the array 502 for reading, setting, and resetting the phase change memory cells (not shown) in array 502. Addresses are supplied on bus 512 to word line decoder and drivers 504 and bit line decoder 508. Sense circuitry (Sense amplifiers) and data-in structures in block 514, including voltage and/or current sources for the read, set, and reset modes are coupled to bit line decoder 508 via data bus 516. Data is supplied via a data-in line 518 from input/output ports on integrated circuit 500, or from other data sources internal or external to integrated circuit 500, to data-in structures in block 514. Other circuitry 520 may be included on integrated circuit 500, such as a general purpose processor or special purpose application circuitry, or a combination of modules providing system-on-a-chip functionality supported by array 502. Data is supplied via a data-out line 522 from the sense amplifiers in block 514 to input/output ports on integrated circuit 500, or to other data destinations internal or external to integrated circuit 500.

A controller 524 implemented in this example, using a bias arrangement state machine, controls the application of bias circuitry voltage and current sources 526 for the application of bias arrangements including read, program, erase, erase verify and program verify voltages and/or currents for the word lines and bit lines. In addition, bias arrangements for melting/cooling cycling may be implemented. Controller 524 may be implemented using special-purpose logic circuitry as known in the art. In alternative embodiments, controller 524 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 524. The controller 524 is configured in embodiments described herein, to execute set operations for memory cells in the array, where the set operations include a set speed of 500 ns or less, where the set speed can be determined as the set pulse width from the start of the fast rising edge to the end of the ramped or slower falling edge The controller 524 is configured in embodiments described herein, to execute reset operations for memory cells in the array, where the reset currents are 200 microamps or less.

New phase-change materials based on the dielectric-doped, Sb-rich GST-225 family can provide fast switching speed and also excellent data retention While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A phase change memory device comprising:
   an array of memory cells, memory cells in the array comprising respectively, a first electrode and second electrode, and a body of phase change memory material between the first and second electrodes, wherein the body of phase change memory material comprises a combination of Ge, Sb, and Te with a dielectric additive in amounts effective to provide a crystallization transition temperature greater than to 160° C.;
   wherein the combination of Ge, Sb, and Te comprises $Ge_xSb_yTe_z$, wherein x, y and z are atomic percentages, with a Ge atomic concentration x within a range from 13% to 18%, an Sb atomic concentration y within a range from 18% to 32% and a Te atomic concentration z within a range from 34% to 50%, and further comprising the dielectric additive with an atomic concentration within a range of 10% to 30%; and
   a controller coupled to the array, and configured to execute set operations and reset operations for memory cells in the array.

2. The device of claim 1, wherein the combination of Ge, Sb, and Te with a dielectric additive includes amounts effective to provide a crystallization transition temperature greater than to 170° C.

3. The device of claim 1, wherein the combination of Ge, Sb, and Te with a dielectric additive includes amounts effective to provide a crystallization transition temperature greater than to 190° C.

4. The device of claim 1, wherein the reset operations include a reset current of 200 µAmp, or less.

5. The device of claim 1, wherein the dielectric additive comprises a Si atomic concentration within a range from 7% to 17% and an O atomic concentration within a range from 0% to 23%.

6. The device of claim 1, wherein the set operations include a set speed of 500 ns or less.

7. The device of claim 1, wherein the array has an endurance on the order of $10^7$ cycles or more.

8. The device of claim 1, wherein the array retains useable data for at least one year at operating temperatures of 85° C., or more.

9. A device for storage class data storage, comprising:

an array of memory cells, memory cells in the array comprising respectively, a first electrode and second electrode, and a body of phase change memory material between the first and second electrodes, wherein the body of phase change memory material comprises a combination of Ge, Sb, and Te with a dielectric additive in amounts effective to provide a crystallization transition temperature greater than to 190° C.;

wherein the combination of Ge, Sb, and Te comprises $Ge_xSb_yTe_z$, wherein x, y and z are atomic percentages, with a Ge atomic concentration x within a range from 13% to 18%, an Sb atomic concentration y within a range from 18% to 32% and a Te atomic concentration z within a range from 34% to 50%, and further comprising the dielectric additive with an atomic concentration within a range of 10% to 30%; and a controller coupled to the array, and configured to execute set operations and reset operations for memory cells in the array, wherein the set operations include a set speed of 500 ns or less and the reset operations include a reset current of 200 µAmp, or less.

10. The device of claim 9, wherein the dielectric additive comprises a Si atomic concentration within a range from 7% to 17% and an O atomic concentration within a range from 0% to 23%.

11. The device of claim 9, wherein the array has an endurance on the order of $10^7$ cycles or more.

* * * * *